United States Patent
Zhou et al.

(10) Patent No.: US 12,471,415 B2
(45) Date of Patent: Nov. 11, 2025

(54) NON-DIRECT ELECTRICAL CONTACT ORIENTATION ORDERED NLED LIGHT-EMITTING DISPLAY DEVICE

(71) Applicants: FUZHOU UNIVERSITY, Fujian (CN); MINDU INNOVATION LAB, Fujian (CN)

(72) Inventors: Xiongtu Zhou, Minhou County (CN); Guixiong Chen, Fujian (CN); Tailiangi Guo, Fujian (CN); Yongai Zhang, Fujian (CN); Chaoxing Wu, Fujian (CN); Zhixian Lin, Fujian (CN); Qun Yan, Fujian (CN)

(73) Assignee: FUZHOU UNIVERSITY:MINDU INNOVATION LAB, Fujian (CN)

( * ) Notice: Subject to any disclaimer, the term of this patent is extended or adjusted under 35 U.S.C. 154(b) by 643 days.

(21) Appl. No.: 17/768,469

(22) PCT Filed: Aug. 31, 2020

(86) PCT No.: PCT/CN2020/112392
§ 371 (c)(1),
(2) Date: Apr. 13, 2022

(87) PCT Pub. No.: WO2021/073281
PCT Pub. Date: Apr. 22, 2021

(65) Prior Publication Data
US 2024/0297272 A1    Sep. 5, 2024

(30) Foreign Application Priority Data

Oct. 16, 2019    (CN) .......................... 201910982274.8

(51) Int. Cl.
*H10H 20/833*    (2025.01)
*H01L 25/075*    (2006.01)
*H10H 20/819*    (2025.01)

(52) U.S. Cl.
CPC ....... *H10H 20/833* (2025.01); *H01L 25/0753* (2013.01); *H10H 20/819* (2025.01)

(58) Field of Classification Search
CPC ...... H01L 33/42; H01L 25/0753; H01L 33/20
See application file for complete search history.

(56) References Cited

U.S. PATENT DOCUMENTS

2016/0323952 A1*    11/2016    Li .......................... F21V 31/005
2019/0272456 A1*    9/2019    Roach ................. H01L 25/0753
(Continued)

*Primary Examiner* — Sue A Purvis
*Assistant Examiner* — William C. Trice, III
(74) *Attorney, Agent, or Firm* — Jose Cherson Weissbrot

(57) ABSTRACT

A non-direct electrical contact orientation ordered nLED light-emitting display device comprises an upper drive electrode substrate, an upper drive electrode, an nLED grain sheet, a lower drive electrode and a lower drive electrode substrate that are sequentially arranged from top to bottom, and is further provided with an AC drive control module having two ends connected to the upper drive electrode and the lower drive electrode respectively. The nLED grain sheet is formed by a plurality of nLED grains that are arranged in order, so when the nLED grain sheet is disposed between the electrode substrates, a light-emitting layer of each nLED grain is parallel to the electrode substrates and perpendicular to the electric field. At least one of the upper drive electrode and the lower drive electrode is isolated from the nLED grains by an insulating dielectric layer. In presence of the AC drive signal, the nLED grains are lighted up through electromagnetic coupling. The invention adopts a non-direct electrical contact method to realize ordered nLED light-emitting display, thus omitting the transfer of a greater number of μLEDs and nLEDs and effectively reducing the process cost.

7 Claims, 1 Drawing Sheet

(56) References Cited

U.S. PATENT DOCUMENTS

2020/0388723 A1* 12/2020 Ahmed ................... H01L 33/42
2020/0403119 A1* 12/2020 Sakong ................ H01L 27/153

* cited by examiner (a)

(b)

NON-DIRECT ELECTRICAL CONTACT ORIENTATION ORDERED NLED LIGHT-EMITTING DISPLAY DEVICE

BACKGROUND OF THE INVENTION

1. Technical Field

The invention relates to the field of integrated semiconductor light-emitting and display, in particular to a non-direct electrical contact orientation ordered nLED light-emitting display device.

2. Description of Related Art

LED display has been widely applied to various occasions because of its advantages of self-illumination, high brightness and luminous efficacy, low power consumption and high stability. With the decrease of the size of LED chips and the pixel pitch, LED display is expected to fulfill flexible, highly-transparent, interactive and modularly-stitched display and is regarded as a revolutionary display technique with complete functions and capable of being applied to all fields. Wherein, μLED display is a novel display technique based on an array formed by micron-sized LED light-emitting pixels, and nLED (nano-LED) display is a novel display technique based on an array formed by nano-sized LED light-emitting pixels. At present, leading LED chip manufacturers, display panel manufacturers and display application manufacturers at home and abroad have actively devoted to the development of ultrahigh-density and small-pitch LED (μLED and nLED) display. However, when the size of LED chips decreases to a certain degree, operations on the chips will become increasingly difficult. Particularly, for nLED grains, how to transfer grains with different light-emitting colors onto a circuit substrate with mechanical tools and fulfill accurate electrical contact between the μLED grains and drive electrodes through perfect alignment and bonding have become a great technical challenge.

BRIEF SUMMARY OF THE INVENTION

In view of this, the objective of the invention is to provide a non-direct electrical contact orientation ordered nLED light-emitting display device, which avoids the complex bonding of LED chips and drive chips and a great number of chip transfer processes greatly reduce the fabrication complexity of the nLED light-emitting device, thus effectively reduce the fabrication cycle and cost of the nLED device.

To fulfill the above objective, the invention adopts the following technical solution:

A non-direct electrical contact orientation ordered nLED light-emitting display device comprises an upper drive electrode substrate, an upper drive electrode, an nLED grain sheet, a lower drive electrode and a lower drive electrode substrate that are sequentially arranged from top to bottom, and is further provided with an AC drive control module having two ends connected to the upper drive electrode and the lower drive electrode respectively, wherein the nLED grain sheet is formed by a plurality of nLED grains that are arranged in order, so when the nLED grain sheet is disposed between the electrode substrates, a light-emitting layer of each nLED grain is parallel to the electrode substrates and perpendicular to the electric field; and at least one of the upper drive electrode and the lower drive electrode is isolated from the nLED grains by an insulating dielectric layer, and in presence of the AC drive signal, the nLED grains light up through electromagnetic coupling.

Further, each nLED grain comprises one light-emitting layer or multiple light-emitting layers stacked in parallel, a horizontal size parallel to the light-emitting layer of the nLED grain is 1 nm-1 μm, and a vertical size perpendicular to the light-emitting layer of the nLED grain is 1 μm-10 μm.

Further, the nLED grain sheet has a thickness of 1 μm-10 μm and a horizontal size of 20 μm-1000 μm, so when the nLED grain sheet is disposed between the electrode substrates, the light-emitting layers of the nLED grains are parallel to the dielectric layer and the drive electrodes and perpendicular to the electric field, thus improving luminous efficiency.

Further, the nLED grains are arranged in order through UV lithography, electron beam lithography, ion beam lithography, nanoimprint lithography, laser lithography, self-assembly and template growth.

Further, at least one of the upper drive electrode and the lower drive electrode is a transparent electrode, and the two electrodes are spaced apart from each other to form an independent space.

Further, the insulating dielectric layer is disposed on surfaces of the upper drive electrode and the lower drive electrode or on upper subsurface and lower surfaces of the nLED grain sheet.

Further, the AC drive control module provide an alternating voltage with a magnitude and polarity varying with time, the waveform of the alternating voltage includes a sinusoidal waveform, a triangular waveform, a square waveform, a pulse waveform and a composite waveform thereof, and the alternating voltage is at a frequency of 1 Hz-1000 MHz and has a controllable duty cycle.

Further, the upper drive electrode and the lower drive electrode are made of rigid or flexible substrate materials, and a plurality of nLED grain sheets are disposed between every two pixel electrode.

Compared with the prior art, the invention has the following beneficial effects:

The invention voids complex bonding of LED chips and drive chips and transfer of a great number of chips and greatly reduces the fabrication complexity of the nLED light-emitting device, thus effectively reducing the fabrication cycle and cost of the nLED device.

In the figures: 100, upper drive electrode substrate; 101, upper drive electrode; 200, lower drive electrode substrate; 201, lower drive electrode; 300, nLED grain; 400, non-direct electrical contact module; 301, buffer layer of nLED grain; 302, n-type semiconductor layer; 303, light-emitting layer; 304, p-type semiconductor layer; 305, insulating layer.

DETAILED DESCRIPTION OF THE INVENTION

The invention will be further explained below in conjunction with the accompanying drawings and embodiments.

Figure 1:
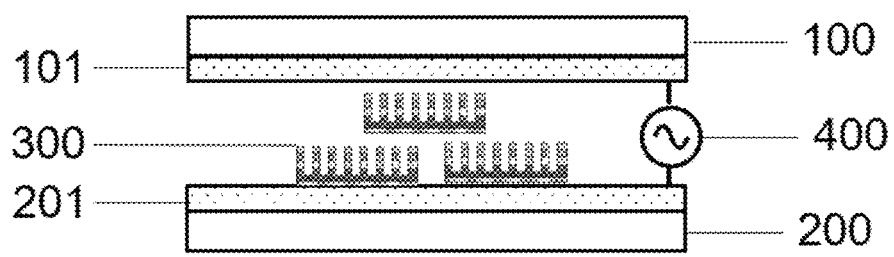
FIG. 1 is a structural diagram of a non-direct electrical contact orientation ordered nLED light-emitting display device in one embodiment of the invention.

Referring to FIG. 1, the invention provides a non-direct electrical contact orientation ordered nLED light-emitting display device, comprising an upper drive electrode substrate, an upper drive electrode, an nLED grain sheet, a lower drive electrode and a lower drive electrode substrate that are sequentially arranged from top to bottom, wherein the non-direct electrical contact orientation ordered nLED light-emitting display device is further provided with an AC drive control module having two ends connected to the upper drive electrode and the lower drive electrode respectively; the nLED grain sheet is formed by a plurality of nLED grains that are arranged in order, so when the nLED grain sheet is disposed between the electrode substrates, a light-emitting layer of each of the nLED grains is parallel to the electrode substrates and perpendicular to the electric field; and the drive electrodes are isolated from the nLED grains by an insulating dielectric layer, and in presence of the AC drive signal, the nLED grains light up through electromagnetic coupling.

Figure 2:
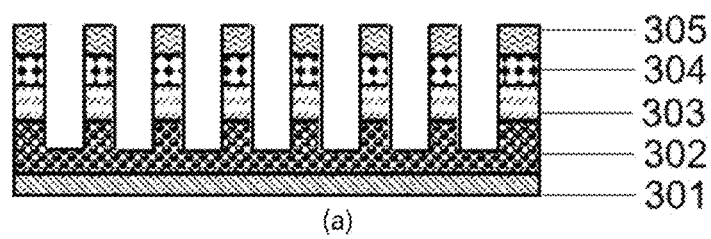
FIG. 2 is a structural diagram of nLED grains in one embodiment of the invention.
Figure 2:
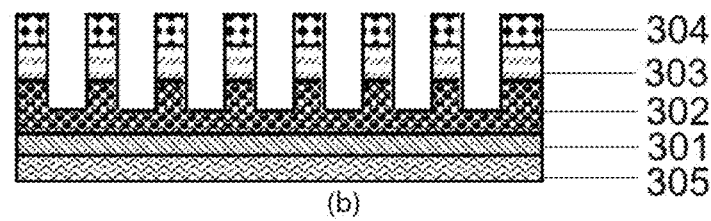

As shown in FIG. 2, in this embodiment, each of the nLED grains is a GaN-matrix LED formed through an epitaxial method, and comprises a buffer layer 301, an n-doped GaN layer 302, a multi-quantum well light-emitting layer 303 and a p-doped GaN layer 304, and silicon oxide with a thickness of 200 nm is deposited on a surface of an epitaxial chip to form an insulating dielectric layer 305. Each nLED grain comprises one light-emitting layer or multiple light-emitting layers stacked in parallel, a horizontal size parallel to the light-emitting layer of the nLED grain is 1 nm-1 µm, and a vertical size perpendicular to the light-emitting layer of the nLED grain is 1 µm-10 µm.

Preferably, cylindrical nLED grains are prepared on an LED epitaxial chip through nanoimprint lithography and ICP, and a wafer containing nLED grains is cut by laser to form a grain sheet with a 100*100 cylindrical nLED grain array.

Preferably, a horizontal size parallel to the light-emitting layer of each nLED grain (diameter of each nLED grain) is 500 nm, a center distance between the grains is 1 µm, and a lithography depth (length of the grain) is about 5 µm. After cutting, each nLED grain sheet has a thickness of about 10 µm (including the non-etched n-doped GaN layer and buffer layer) and a horizontal size of 100 µm*100 µm.

When the grain sheet is disposed between the electrode substrates through ink-jet printing, because the ratio of a horizontal size to a vertical size of the nLED grain sheet is 10:1, the nLED grain sheet has to lie between the two electrode substrates, that is, the light-emitting layer of each nLED grain is parallel to the electrode substrates and perpendicular to the electric field.

The drive electrodes are isolated from the nLED grains through dielectric layers, and in presence of the AC drive signal, the nLED grains light up through electrical coupling.

Preferably, the drive electrode substrates are prepared by depositing indium tin oxide (ITO) on glass substrates, have a thickness of about 150 nm, and a sheet resistance of about 20 Ω/sq.

Preferably, an alternating voltage is in a sinusoidal waveform and at a frequency of 100 KHz, and has a peak value of 100V.

In this embodiment, the nLED light-emitting display device completes electron and hole recombination by means of homogeneous pn junction nanowires to generate a radiative jump, and direct electrical contact between n-type semiconductor layers and p-type semiconductor layers of the nLED grains and the drive electrodes is avoided. Considering of the poor orientation and low luminous efficiency of nLED grains between electrodes, in the invention, a batch of nLED grains are arranged on a semiconductor layer or an insulating layer in order so as to form an nLED grain sheet with a horizontal size being far greater than a vertical size (the thickness of the grain sheet), so that the nLED grain sheet can only lie between the electrode substrates and cannot be erected between the electrode substrates, which ensures that the light-emitting layers of the nLED grains are parallel to the electrode substrates and perpendicular to the electric field, thus greatly improving electrical coupling efficiency and luminous efficiency.

The above embodiments are merely preferred ones of the invention. All equivalent variations and modifications made according to the patent scope of the application of invention should fall within the protection scope of the invention.

What is claimed is:

1. A non-direct electrical contact orientation ordered nLED light-emitting display device, comprising an upper drive electrode substrate, an upper drive electrode, an nLED grain sheet, a lower drive electrode and a lower drive electrode substrate that are sequentially arranged from top to bottom, and being further provided with an AC drive control module having two ends connected to the upper drive electrode and the lower drive electrode respectively, wherein the nLED grain sheet is formed by a plurality of nLED grains that are arranged in order;
the nLED grain sheet is disposed between the electrode substrates, a light-emitting layer of each nLED grain of the plurality of nLED grains is parallel to the electrode substrates and perpendicular to a electric field;
and at least one of the upper drive electrode and the lower drive electrode is isolated from the plurality of nLED grains by an insulating dielectric layer.

2. The non-direct electrical contact orientation ordered nLED light-emitting display device according to claim 1, wherein each nLED grain of the plurality of nLED grains comprises one light-emitting layer or multiple light-emitting layers stacked in parallel;
a horizontal size parallel to the light-emitting layer of the nLED grain is 1 nm-1 µm, and a vertical size perpendicular to the light-emitting layer of the nLED grain is 1 µm-10 µm.

3. The non-direct electrical contact orientation ordered nLED light-emitting display device according to claim 1, wherein the nLED grain sheet has a thickness of 1 µm-10 µm and a horizontal size of 20 µm-1000 µm;
the nLED grain sheet is disposed between the electrode substrates, the light-emitting layers of the plurality of nLED grains are parallel to the dielectric layer and the drive electrodes and perpendicular to the electric field.

4. The non-direct electrical contact orientation ordered nLED light-emitting display device according to claim 1, wherein the plurality of nLED grains are arranged in order through UV lithography, electron beam lithography, ion beam lithography, nanoimprint lithography, laser lithography, self-assembly or template growth.

5. The non-direct electrical contact orientation ordered nLED light-emitting display device according to claim 1, wherein at least one of the upper drive electrode and the lower drive electrode is a transparent electrode;
and the two electrodes are spaced apart from each other to form an independent space.

6. The non-direct electrical contact orientation ordered nLED light-emitting display device according to claim 1, wherein the insulating dielectric layer is disposed on surfaces of the upper drive electrode and the lower drive electrode or on upper surfaces and lower surfaces of the nLED grain sheet.

7. The non-direct electrical contact orientation ordered nLED light-emitting display device according to claim 1, wherein the AC drive control module provides an alternating voltage with a magnitude and polarity varying with time;
- a waveform of the alternating voltage includes a sinusoidal waveform, a triangular waveform, a square waveform, a pulse waveform or a composite waveform thereof;
- and the alternating voltage is at a frequency of 1 Hz-1000 MHz.

\* \* \* \* \*